United States Patent
Tanida et al.

(10) Patent No.: US 6,337,814 B1
(45) Date of Patent: Jan. 8, 2002

(54) SEMICONDUCTOR MEMORY DEVICE HAVING REFERENCE POTENTIAL GENERATING CIRCUIT

(75) Inventors: Susumu Tanida; Masanori Hayashikoshi, both of Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/909,977

(22) Filed: Jul. 23, 2001

(30) Foreign Application Priority Data

Feb. 14, 2001 (JP) ............................ 13-036511

(51) Int. Cl.[7] .............................................. G11C 7/14
(52) U.S. Cl. ........................ 365/189.09; 365/189.05; 365/201; 365/193; 365/191; 365/226; 327/538; 327/543; 327/537; 327/94; 327/91
(58) Field of Search ........................ 365/189.09, 201, 365/191, 193, 189.05, 226; 327/94, 91, 535, 537, 538, 543

(56) References Cited

U.S. PATENT DOCUMENTS

| | | | |
|---|---|---|---|
| 5,959,471 A | 9/1999 | Weinfurtner | 327/94 |
| 5,959,934 A * | 9/1999 | Chen et al. | 365/230.06 |
| 6,163,487 A * | 12/2000 | Ghilardelli | 365/189.09 |
| 6,240,025 B1 * | 5/2001 | Park | 365/189.09 |
| 6,278,638 B1 * | 8/2001 | Tomita et al. | 365/189.07 |

FOREIGN PATENT DOCUMENTS

| | | | |
|---|---|---|---|
| JP | 9-69014 | 3/1997 | G05F/3/30 |
| JP | 11-175172 | 7/1999 | G05F/1/56 |

* cited by examiner

*Primary Examiner*—Andrew Q. Tran
(74) *Attorney, Agent, or Firm*—McDermott, Will & Emery

(57) ABSTRACT

A test mode reference potential generating circuit outputs a reference potential from an output node by activation of a test mode signal. When a sample signal is in an activated state, a transfer gate is turned on, and a capacitor stores the reference potential. When the test is being conducted, the transfer gate is turned off by inactivation of the sample signal, and thus the reference potential stored in the capacitor is output from a node. Thus, the semiconductor memory device according to the present invention can generate a stable reference potential during the test mode.

7 Claims, 8 Drawing Sheets

SEMICONDUCTOR MEMORY DEVICE HAVING REFERENCE POTENTIAL GENERATING CIRCUIT

BACKGROUND OF THE INVENTION

1. Field of the Invention

The present invention relates to a semiconductor memory device, and more particularly, to a semiconductor memory device having a test mode.

2. Description of the Background Art

In general, a semiconductor memory device is provided with an internal boost power-supply (hereinafter referred to as VPP) generating circuit as a power-supply for charging word lines in a memory cell array, and is further provided with a reference potential generating circuit supplying a reference potential to the VPP generating circuit.

Moreover, a semiconductor memory device having a test mode is provided with a test mode reference potential generating circuit, i.e. a reference potential generating circuit for the test mode, in addition to the reference potential generating circuit used in a normal operation.

FIG. 14 is a circuit diagram of a test mode reference potential generating circuit in a semiconductor memory device having a test mode.

Referring to FIG. 14, the test mode reference potential generating circuit includes resistance elements 1, 2 and an N-channel MOS transistor 3. Resistance element 1 is connected between a power-supply node VCC and an output node B1. Resistance element 2 has one end connected to output node B1 and the other end connected to the drain of N-channel MOS transistor 3. The source of N-channel MOS transistor 3 is connected to a ground node 4, and a test mode signal TM activated in the test mode is input into the gate of N-channel MOS transistor 3.

During the test mode, the test mode signal TM input into the gate of N-channel MOS transistor 3 is activated (to be at a logic high or "H" level), and thus N-channel MOS transistor 3 is turned on. As a result, the test mode reference potential generating circuit divides an external power-supply potential VCC by resistance elements 1 and 2, and outputs the divided potential from output node B1 as a reference potential Vref to be supplied to the VPP generating circuit.

The test conducted in the semiconductor memory device including the test mode reference potential generating circuit having such a circuit configuration is often used in a burn-in. In the burn-in, it is undesirable for the potential output from the VPP generating circuit to vary during the test mode. This is because, the acceleration factor of a gate oxide film is usually determined on the basis of a potential value output from the VPP generating circuit, i.e. the highest potential, so that the raise of the potential output from the VPP generating circuit as a result of the raised external power-supply potential VCC by the operation of the device during the test would apply an excessive stress to the device, which may result in destruction of the device. Moreover, if the operation of the device consumes excessive current, external power-supply potential VCC is lowered, preventing application of a desired stress to the device.

However, in the conventional semiconductor device, the potential divided from external power-supply potential VCC was always supplied to the VPP generating circuit as a reference potential Vreft during the test mode, as described above, so that reference potential Vreft was directly affected by variations of external power-supply potential VCC, resulting in variations of the value of Vreft.

SUMMARY OF THE INVENTION

It is an object of the present invention to provide a semiconductor memory device including a reference potential generating circuit capable of generating a stable reference potential during a test mode.

According to the present invention, a semiconductor memory device having a test mode includes a memory cell array; an internal potential generating circuit generating an internal potential; a reference potential generating circuit generating a reference potential and supplying the reference potential to the internal potential generating circuit; a control circuit controlling the memory cell array in response to a plurality of control signals and address signals input from an external source. The control circuit outputs a test mode signal indicating the test mode in response to the plurality of control signals and address signals, and further outputs a sample signal in response to the test mode signal; and the reference potential generating circuit latches the reference potential in response to the sample signal and supplies the latched reference potential to the internal potential generating circuit.

Thus, the reference potential latched during the test mode is supplied to the internal potential generating circuit, so that the internal potential is stabilized during the test mode.

Preferably, the reference potential generating circuit includes an output stage outputting the reference potential in response to the test mode signal, a latch stage latching the reference potential output from the output stage, and a switch stage connecting the output stage to the latch stage in response to the sample signal.

More preferably, the latch stage includes a capacitor, and the switch stage includes a transfer gate which is turned on in response to the sample signal.

This allows external power-supply potential VCC to be cut off from the internal potential generating circuit when the test is executed.

Preferably, the latch stage includes a register; and the reference potential generating circuit further includes an analog-to-digital converting circuit converting the reference potential output from the output stage from an analog value into a digital value to be supplied to the register via the switch stage and a digital-to-analog converting circuit converting the reference potential output from the register from a digital value into an analog value.

This eliminates the needs for the latch stage to frequently latch the reference potential from the output stage during the test mode.

More preferably, the control circuit includes a command decoder receiving the control signal and outputting a command, an address decoder receiving the address signal and outputting a signal, a test signal generating circuit generating the test signal by a combination of the command output from the command decoder and the signal output from the address decoder, and a sample signal generating circuit outputting a sample signal in response to the test signal.

This enables generation of a test signal and a sample signal by a combination of a control signal and an address signal.

More preferably, the sample signal generating circuit generates the sample signal by a combination of the test signal, a mode register setting command output from the command decoder and the signal output from the address decoder.

More preferably, the sample signal generating circuit generates the sample signal by the combination of the test signal, the control signal and the signal output from the address decoder.

According to the present invention, a semiconductor memory device can be provided, which is capable of supplying a stable reference potential during the test mode without any adverse effect from possible variations of the external power-supply potential due to the device operation or the like.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
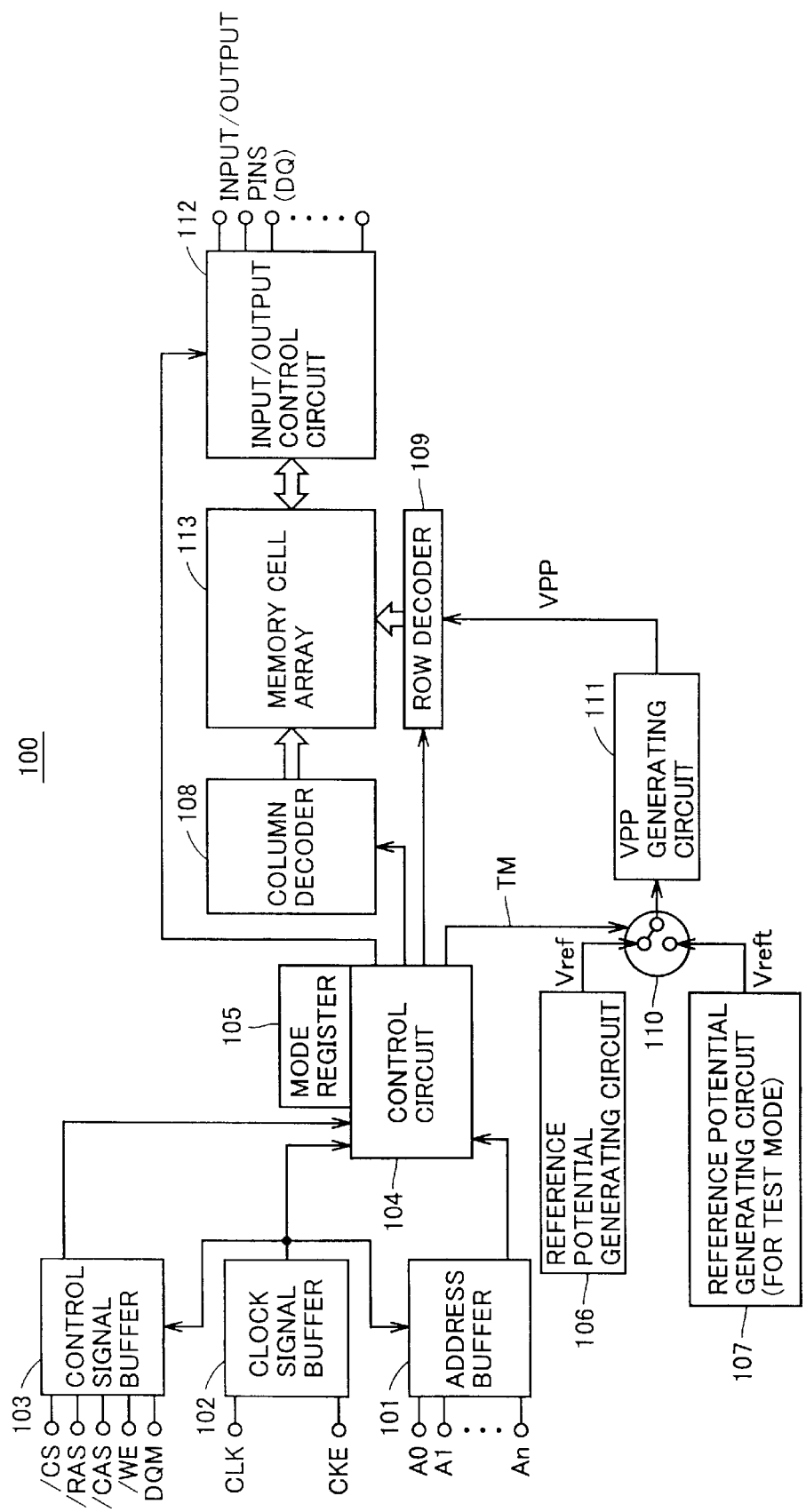
FIG. 1 is a schematic block diagram showing an entire configuration of a semiconductor memory device according to the first embodiment of the present invention.

FIG. 1 is a schematic block diagram showing the entire configuration of the semiconductor memory device according to the first embodiment of the present invention.

Referring to FIG. 1, a semiconductor memory device 100 includes a memory cell array 113, an address buffer 101 receiving external address signals A0 to An and generating internal address signals A0 to An; a dock signal buffer 102 receiving an external clock signal CLK and a clock enable signal CKE and generating an internal clock signal; a control signal buffer 103 taking in a chip select signal /CS, a row address strobe signal /RAS, a column address strobe signal /CAS, a write enable signal /WE and an input/output data mask signal DQM; a control circuit 104; a mode register 105; a row decoder 108 receiving a signal output from control circuit 104 and selecting a row of memory cell array 113; a column decoder 109 receiving a signal output from control circuit 104 and selecting a column of memory cell array 113; a reference potential generating circuit 106; a test mode reference potential generating circuit 107; a switching circuit 110; a VPP generating circuit 111; and an input/output control circuit 112.

Input/output control circuit 112 receives a signal output from control circuit 104 and outputs the data read from memory cell array 113 or writes the data input from the outside into memory cell array 113.

Control circuit 104 receives the internal clock signal, internal address signals A0 to An, and the output of control signal buffer 103, and controls the entire chip.

Mode register 105 latches the operation mode instructed by control circuit 104.

Figure 2:
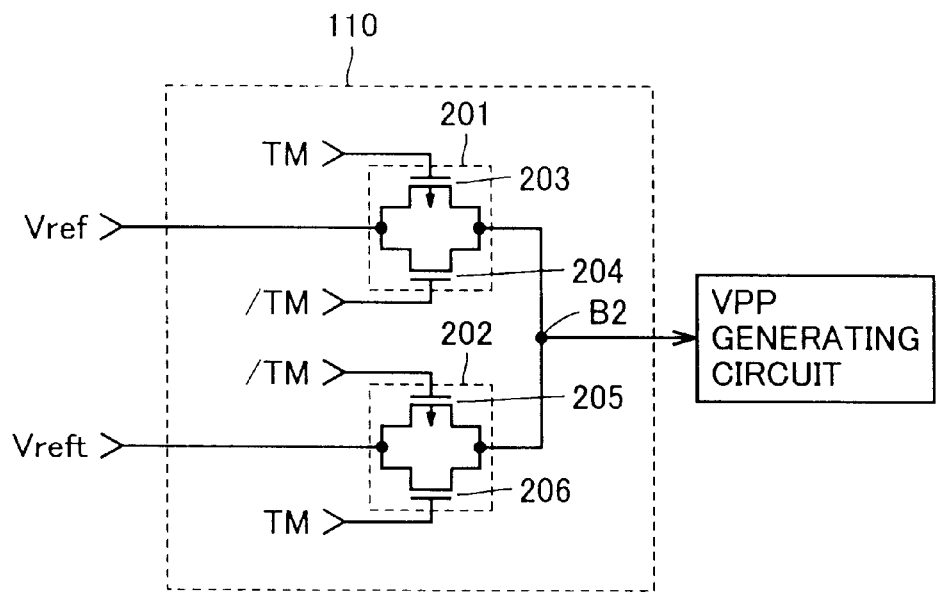
FIG. 2 is a circuit diagram of a switching circuit of the semiconductor memory device shown in FIG. 1.

FIG. 2 is a circuit diagram of switching circuit 110 of the semiconductor memory device shown in FIG. 1.

Referring to FIG. 2, switching circuit 110 includes transfer gates 201 and 202. Transfer gate 201 is constituted by a P-channel MOS transistor 203 and an N-channel MOS transistor 204, and is connected between a reference potential generating circuit 106 and an output node B2. Further, transfer gate 202 is constituted by a P-channel MOS transistor 205 and an N-channel MOS transistor 206, and is connected between test mode reference potential generating circuit 107 and output node B2. Test mode signals TM and /TM output from control circuit 104 are input into the gates of the respective transistors in each of transfer gates 201 and 202. Test mode signals TM and /TM will be described later.

Next, the operation of switching circuit 110 will be described.

During the normal operation, test mode signals TM and /TM are being inactivated, so that transfer gate 201 is turned on whereas transfer gate 202 is turned off. As a result, reference potential Vref output from reference potential generating circuit 106 is output from output node B2.

During the test mode, test mode signals TM and /TM are being activated, so that transfer gate 201 is turned off whereas transfer gate 202 is turned on. As a result, reference potential Vreft output from test mode reference potential generating circuit 107 is output from node B2, to be supplied to VPP generating circuit 111.

Figure 3:
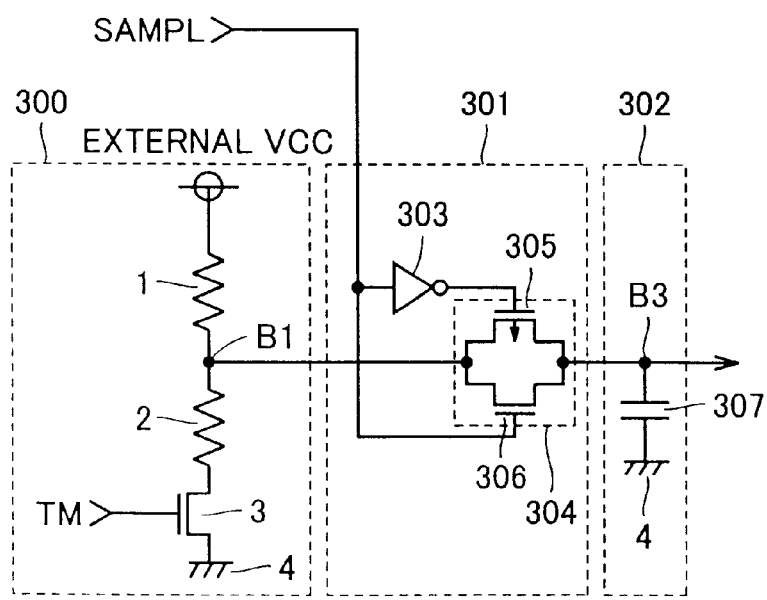
FIG. 3 is a circuit diagram of a test mode reference potential generating circuit of the semiconductor memory device shown in FIG. 1.

FIG. 3 is a circuit diagram of test mode reference potential generating circuit 107 of semiconductor memory device 100 shown in FIG. 1.

Referring to FIG. 3, test mode reference potential generating circuit 107 includes an output stage 300 outputting reference potential Vreft, a latch stage 302 holding reference potential Vreft, and a switch stage 301 connecting or cutting off output stage 300 and latch stage 302.

Figure 14:
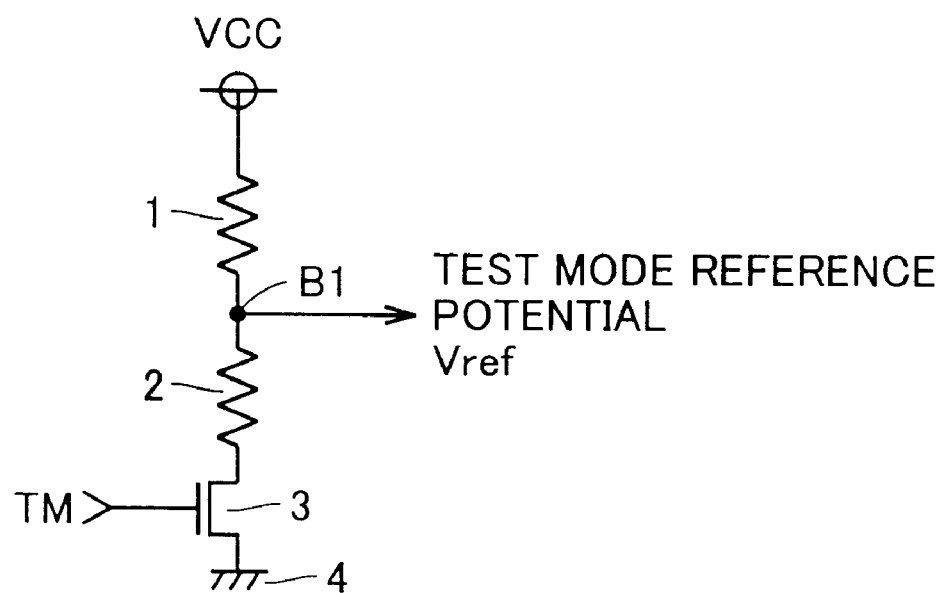
FIG. 14 is a circuit diagram of a test mode reference potential generating circuit in a semiconductor memory device having a test mode.

The circuit configuration of output stage 300 is the same as that of the conventional test mode reference potential generating circuit shown in FIG. 14, so that the description thereof will not be repeated. It is noted that test mode signal TM input into the gate of N-channel MOS transistor 3 is generated in control circuit 104, which will be described later.

Latch stage 302 includes a capacitor 307. Capacitor 307 has one end connected to a ground node 4 and the other end connected to an output node B3.

Switch stage 301 includes a transfer gate 304 and an inverter 303. Transfer gate 304 is constituted by a P-channel MOS transistor 305 and an N-channel MOS transistor 306, and is connected between output nodes B1 and B3. Further, inverter 303 is connected to the gate of P-channel MOS transistor 305. A sample signal SAMPL, which will be described later, is input into the gate of N-channel MOS transistor 306 and inverter 303. When sample signal SAMPL is in an activated state, transfer gate 304 is turned on, connecting output stage 300 and latch stage 302.

Subsequently, a generating circuit for test mode signal TM and sample signal SAMPL will be described.

Figure 4:
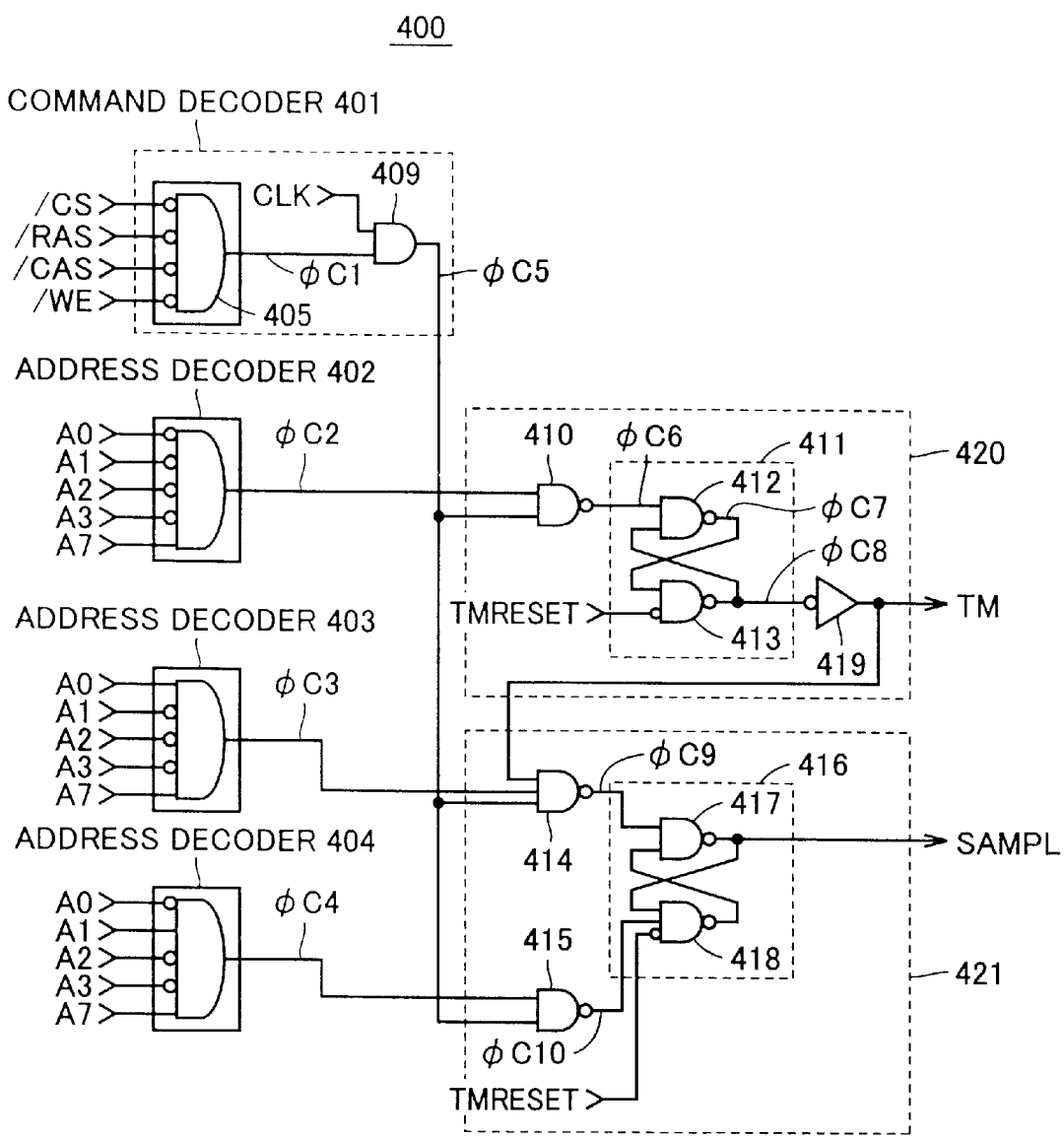
FIG. 4 is a circuit diagram showing a configuration of a test-sample signal generating circuit within a control circuit of the semiconductor memory device shown in FIG. 1.

FIG. 4 is a circuit diagram showing a configuration of a test-sample signal generating circuit 400 within control circuit 104 of semiconductor memory device 100 shown in FIG. 1.

Referring to FIG. 4, test-sample signal generating circuit 400 includes a command decoder 401, address decoders 402 to 404, a TM generating circuit 420, and a SAMPL generating circuit 421.

Command decoder 401 includes AND gates 405 and 409.

AND gate 405 receives a chip select signal /CS, a row address strobe signal /RAS, a column address strobe signal /CAS, and a write enable signal /WE, and outputs a signal $\phi$C1. When chip select signal /CS, row address strobe signal /RAS, column address strobe signal /CAS, write enable signal /WE that are input into AND gate 405 are all at a logic low or "L" level, output signal $\phi$C1 will be at the H level.

Moreover, AND gate 409 receives signal $\phi$C1 output from AND gate 405 and a clock signal CLK, and performs an operation to obtain the logical product of signal $\phi$C1 and clock signal CLK, to output the result of the operation as a signal $\phi$C5.

Address decoder 402 receives address signals A0, A1, A2, A3 and A7, and outputs a signal $\phi$C2. When address signals A0 to A3 are at the L level and address signal A7 is at the H level, output signal $\phi$C2 will be at the H level. The input address signals A0 to A3 and A7 are at the other levels, output signal $\phi$C2 will be at the L level.

Address decoder 403 receives address signals A0, A1, A2, A3 and A7, and outputs a signal $\phi$C3. When address signals A1 to A3 are at the L level and address signals A0 and A7 are at the H level, output signal $\phi$C3 will be at the H level. The input address signals A0 to A3 and A7 are at the other levels, output signal $\phi$C3 will be at the L level.

Address decoder 404 receives address signals A0, A1, A2, A3 and A7, and outputs a signal $\phi$C4. When address signals A0, A2 and A3 are at the L level and address signals A1 and A7 are at the H level, output signal $\phi$C4 will be at the H level. The input address signals A0 to A3 and A7 are at the other levels, output signal $\phi$C4 will be at the L level.

TM generating circuit 420 includes an NAND gate 410, a flip-flop 411 and an inverter 419.

NAND gate 410 receives signal $\phi$C5 output from command decoder 401 and signal $\phi$C2 output from address decoder 402, and performs an operation to obtain the logical product of signals $\phi$C5 and $\phi$C2, to output a signal $\phi$C6 inverted from the operation result.

Flip-flop 411 is constituted by an NAND gate 412 and a logic gate 413. NAND gate 412 receives signal $\phi$C6 output from NAND gate 410 and the output of NAND gate 413, and outputs a signal $\phi$C7. Logic gate 413 receives signal $\phi$C7 and a test reset signal TMRESET which will be described later, and outputs a signal $\phi$C8. When test reset signal TMRESET is at the H level, $\phi$C8 will be at the H level.

Inverter 419 inverts signal $\phi$C8 output from flip-flop 411, and outputs test mode signal TM.

SAMPL generating circuit 421 includes NAND gates 414, 415, and a flip-flop 416.

NAND gate 414 receives signal $\phi$C5 output from command decoder 401, signal $\phi$C3 output from address decoder 403, and test mode signal TM output from TM generating circuit 420, and performs an operation to obtain the logical product of signal $\phi$C5, signal $\phi$C3 and test mode signal TM, to output a signal $\phi$C9 which is inverted from the operation result.

Further, NAND gate 415 receives signal $\phi$C5 output from command decoder 401 and signal $\phi$C4 output from address decoder 404, and performs an operation to obtain the logical product of $\phi$C5 and $\phi$C4, to output a signal $\phi$C10 which is inverted from the operation result.

Flip-flop 416 is constituted by an NAND gate 417 and a logic gate 418. NAND gate 417 receives signal $\phi$C9 output from NAND gate 414 and the output of logic gate 418, and outputs sample signal SAMPL.

Logic gate 418 receives sample signal SAMPL, signal $\phi$C10 output from NAND gate 415, and test reset signal TMRESET which will be described later. When test reset signal TMRESET input into logic gate 418 is at the H level, sample signal SAMPL will be at the L level.

Figure 5:
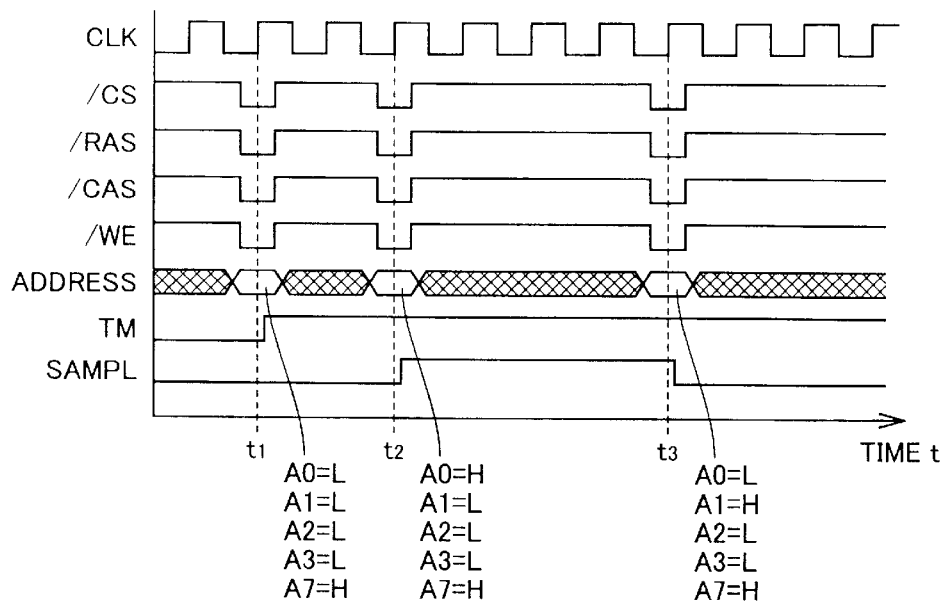
FIG. 5 is a timing chart showing the operation of the test mode reference potential generating circuit during the test mode.

FIG. 5 is a timing chart showing the operation of test mode reference potential generating circuit 107 during the test mode.

Referring to FIG. 5, when chip select signal /CS, row address strobe signal /RAS, column address strobe signal /CAS and write enable signal /WE, which are control signals to be input into AND gate 405, are activated at the leading edge of dock signal CLK input into AND gate 409 within command decoder 401 (time t1), command decoder 401 recognizes that a mode register setting command updating the setting mode of mode register 105 is input, and thus signal $\phi$C5 is activated. During the execution of the mode register setting command, assuming that only address signal A7, of address signals A0 to A3 and A7 input into each of address decoders 402 to 404 in test-sample signal generating circuit 400, is at the H level whereas the other address signals A0 to A3 are at the L level, signal $\phi$C2 output from address decoder 402 of address decoders 402 to 404 will be at the H level, and hence test mode signal TM will be activated to be at the H level. As a result, N-channel MOS transistor 3 within output stage 300 of test mode reference potential generating circuit 107 is turned on, and thus reference potential Vreft is output from node B1.

At that moment, sample signal SAMPL is being inactivated, so that transfer gate 304 in switch stage 301 of test mode reference potential generating circuit 107 is being turned off, not supplying reference potential Vreft to VPP generating circuit 111.

Next, at time t2, the mode register setting command is input as in the case with time ti, while address signals A0 and A7, of address signals A0 to A3 and A7 input into each address decoders 402 to 404 in test-sample signal generating circuit 400, are set to be at the H level, and the other address signals A1 to A3 are set to be at the L level.

At that moment, signal $\phi$C3 output from address decoder 403 of address decoders 402 to 404 attains to the H level. As a result, signal $\phi$C5 in the activated state, test mode signal TM, and signal $\phi$C3 in the activated state are input into NAND gate 414 within SAMPL generating circuit 421, and thus sample signal SAMPL output from flip-flop 416 will be activated.

This is when reference potential Vreft is output from output node B1 of output stage 300 in test mode reference potential generating circuit 107, and transfer gate 304 of switch stage 301 is turned on, so that capacitor 307 within latch stage 302 is charged to the level of reference potential Vreft.

Next, at time t3, when the mode register setting command is input as in the case with time t1 and t2, address signals A1 and A7, of address signals A0 to A3 and A7 input into each address decoders 402 to 404 within test-sample signal generating circuit 400, are set to be at the H level, whereas the other address signals A0, A2 and A3 are set to be at L level.

At that moment, signal φC4 output from address decoder 404 of address decoders 402 to 404 is activated. As a result, signal φC9 output from NAND gate 414 will be in the activated state. Whereas, NAND gate 415 receives signal φC4 in the activated state, signal φC5 in the activated state, and test reset signal TMRESET in the inactivated state, and thus signal φC10 output from NAND gate 415 will be inactivated. As a result, sample signal SAMPL output from flip-flop 416 will be inactivated.

This is when transfer gate 304 of switch stage 301 in test mode reference potential generating circuit 107 is again turned off, cutting off the connection between output stage 300 and latch stage 302.

When the test started after time t3, reference potential Vreft stored in capacitor 307 within latch stage 302 of test mode reference potential generating circuit 107 is supplied to VPP generating circuit 111. At that moment, VPP generating circuit 111 is provided with reference potential Vreft from latch stage 302 which is completely cut off from output stage 300 connected to external power-supply potential VCC, and thus VPP generating circuit 111 will not be affected at all by variations of external power-supply potential VCC during the test mode.

Next, a TMRESET generating circuit generating test reset signal TMRESET which is a signal for terminating the test mode will be described.

Figure 6:
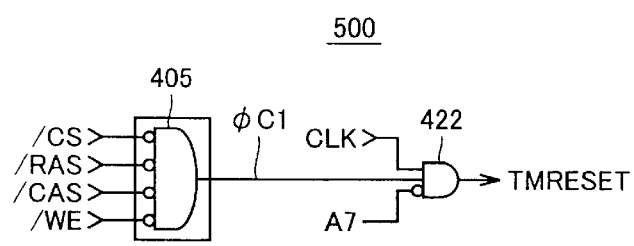
FIG. 6 is a circuit diagram of a TMRESET generating circuit generating a test reset signal TMRESET.

FIG. 6 is a circuit diagram of a TMRESET generating circuit generating a test reset signal TMRESET.

Referring to FIG. 6, TMRESET generating circuit 500 includes AND gates 405 and 422. AND gate 422 receives signal φC1 output from command decoder 401, a clock signal CLK and an address signal A7, and outputs test reset signal TMRESET. In AND gate 422, when signal φC1 and clock signal CLK to be input are at the H level and address signal A7 is at the L level, test reset signal TMRESET will be at the H level.

Figure 7:
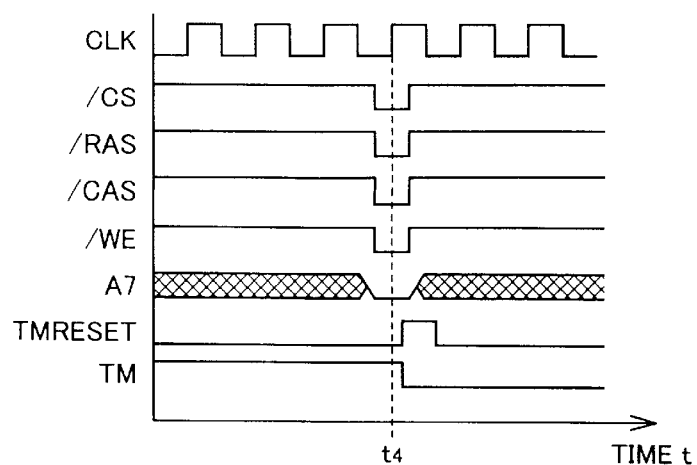
FIG. 7 is a timing chart showing the operation of TMRESET generating circuit.

FIG. 7 is a timing chart showing the operation of TMRESET generating circuit 500.

Referring to FIG. 7, when signal φC1 output from AND gate 405 within TMRESET generating circuit 500 is activated at time t4 and the clock signal is also activated at the same time, i.e., when the mode register setting command in command decoder 401 is input, if address signal A7 input into AND gate 422 is inactivated, test reset signal TMRESET output from AND gate 422 will be activated. The activated test reset signal TMRESET is input into NAND gate 413 within flip-flop 411 in TM generating circuit 420, resulting that signal φC8 output from flip-flop 411 is activated. Inverter 419 receives signal φC8 in the activated state, inactivating the output signal of test mode signal TM.

It is noted that, further in a case where sample signal SAMPL is in an activated state, if test reset signal TMRESET is set to be in the activated state, test reset signal TMRESET is input into NAND gate 418 within flip-flop 416 of SAMPL generating circuit 421, resulting that sample signal SAMPL output from flip-flop 416 will be inactivated.

The operation described above also enables the test to be terminated by the combination of the mode register setting command and an address signal.

Thus, by generating test mode signal TM, sample signal SAMPL and test reset signal TMRESET by the combination of the mode register setting command and the address signal, stable reference potential Vreft can be supplied to VPP generating circuit 111 without the adverse effect of variations of external power-supply potential VCC.

Second Embodiment

Though an embodiment of the present invention has been described above, the present invention is not limited to the above-described embodiment, but can be realized in other forms.

Figure 8:
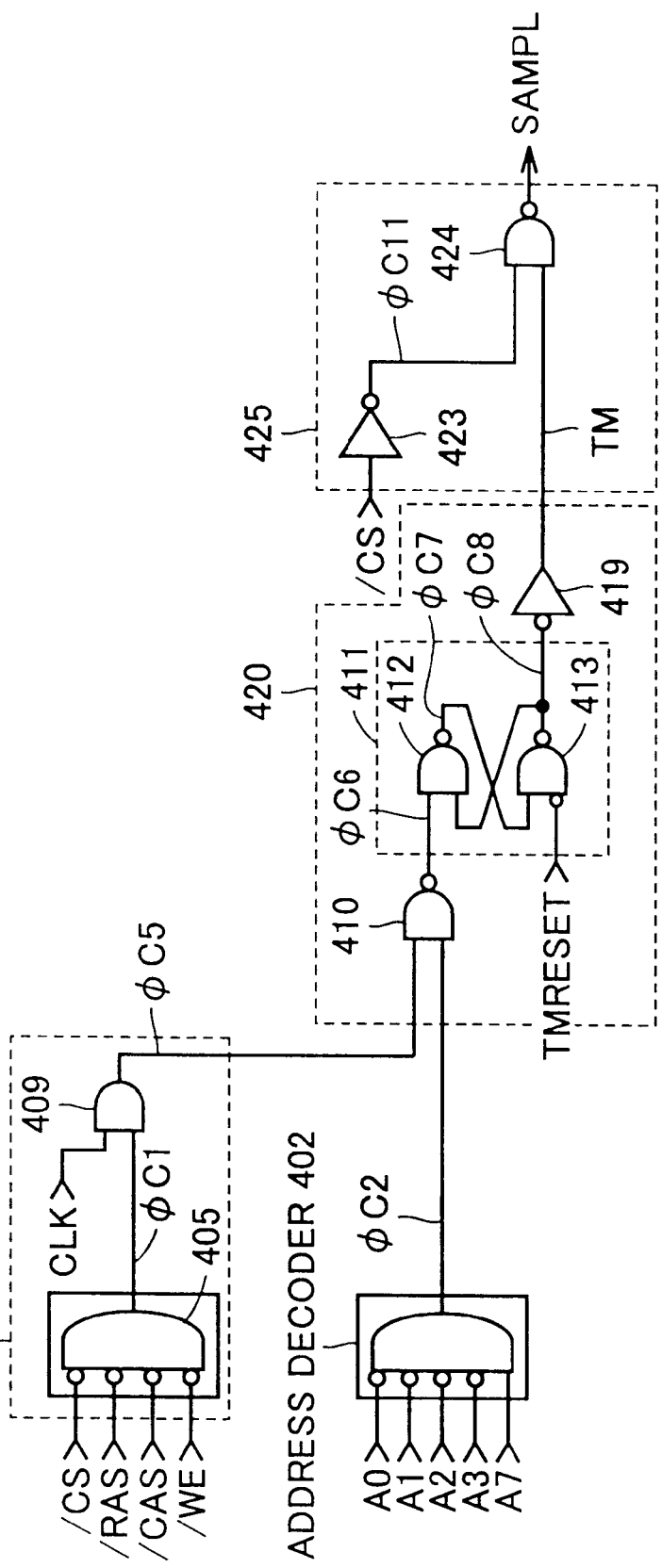
FIG. 8 is a circuit diagram of a test-sample signal generating circuit according to the second embodiment of the present invention.

FIG. 8 is a circuit diagram of a test-sample signal generating circuit 501 according to the second embodiment of the present invention.

Referring to FIG. 8, test-sample signal generating circuit 501 includes a command decoder 401, an address decoder 402, a TM generating circuit 420 and a SAMPL generating circuit 425.

The circuit configurations of command decoder 401, address decoder 402 and TM generating circuit 420 are the same as the circuit configurations of command decoder 401, address decoder 402 and TM generating circuit 420 provided within test-sample signal generating circuit 500 shown in FIG. 4, so that the description thereof will not be repeated.

SAMPL generating circuit 425 includes an inverter 423 and an NAND gate 424.

Inverter 423 receives a chip select signal /CS and inverts the signal to output a signal φC11. NAND gate 424 receives signal φC11 output from inverter 423 and test mode signal TM output from TM generating circuit 420, and performs an operation to obtain the logical product of φC11 and test mode signal TM, to output a signal inverted from the operation result as a sample signal SAMPL.

Figure 9:
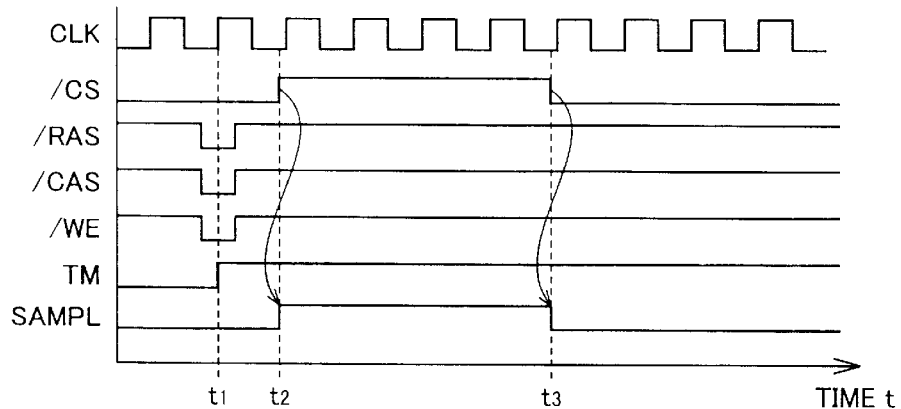
FIG. 9 is a timing chart showing the operation of the test mode reference potential generating circuit when the test is carried out using the test-sample signal generating circuit shown in FIG. 8.

FIG. 9 is a timing chart showing the operation of test mode reference potential generating circuit 107 when the test is conducted using test-sample signal generating circuit 501.

Referring to FIG. 9, the operation of generation of test mode signal TM at time t1 is the same as the operation shown in FIG. 5, so that the description thereof will not be repeated.

After generation of test mode signal TM at time ti, chip select signal /CS is changed to be in an inactivated state (H level) at time t2. The inactivated chip select signal /CS is input into inverter 423 in SAMPL generating circuit 425, and thus signal φC11 output from inverter 423 will be in an inactivated state (L level). Thus, sample signal SAMPL output from NAND gate 424 will be in an activated state (H level).

By the operation described above, transfer gate 304 within switch stage 301 of test mode reference potential generating circuit 107 shown in FIG. 3 is turned on, charging capacitor 307 in latch stage 302 with reference potential Vref.

Subsequently, chip select signal /CS is changed to be in an activated state (L level) at time t3. The chip select signal /CS in the activated state is input into inverter 423 in SAMPL generating circuit 425, and thus signal φC11 output from inverter 423 will be in an activated state (H level). Thus, sample signal SAMPL output from NAND gate 424 will be in an inactivated state (L level).

Therefore, transfer gate 304 within switch stage 301 of test mode reference potential generating circuit 107 is turned off, and hence the connection between latch state 302 and output stage 300 is cut off.

Consequently, if the test starts after time t3, reference potential Vreft stored in capacitor 307 in latch stage 302 of test mode reference potential generating circuit 107 will be supplied to VPP generating circuit 111, and therefore reference potential Vreft will not be affected at all by variations of power-supply node VCC during the test mode.

Therefore, by generating test mode signal TM and sample signal SAMPL by the combination of chip select signal /CS and an address signal, stable reference potential Vref can be supplied to VPP generating circuit 111 without any adverse effect of variations of power-supply node VCC during the test mode.

Third Embodiment

Though activation and inactivation of sample signal SAMPL was performed by chip select signal /CS in the second embodiment described above, activation and inactivation of sample signal SAMPL can also be performed by input/output data mask signal DQM.

Figure 10:
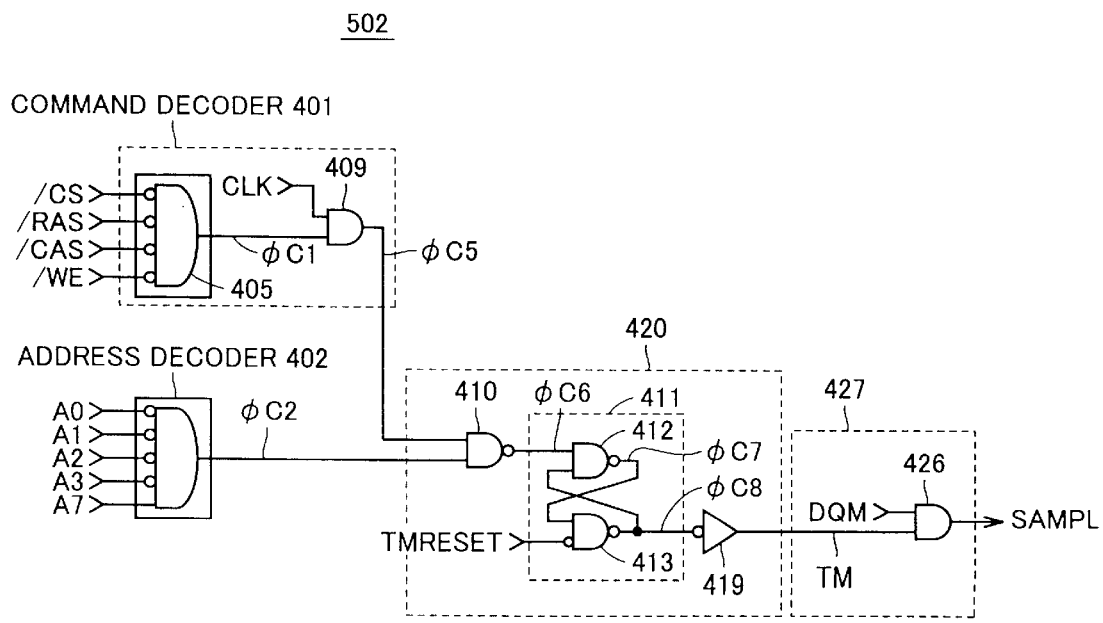
FIG. 10 is a circuit diagram of test-sample signal generating circuit according to the third embodiment of the present invention.

FIG. 10 is a circuit diagram of test-sample signal generating circuit 502 according to the third embodiment of the present invention.

Referring to FIG. 10, test-sample signal generating circuit 502 includes a command decoder 401, an address decoder 402, a TM generating circuit 420 and a SAMPL generating circuit 427.

The circuit configurations of command decoder 401, address decoder 402 and TM generating circuit 420 are the same as the circuit configurations of command decoder 401, address decoder 402 and TM generating circuit 420 provided within test-sample signal generating circuit 500 shown in FIG. 4, so that the description thereof will not be repeated.

SAMPL generating circuit 427 is constituted by an AND gate 426. AND gate 426 receives a test mode signal TM output from TM generating circuit 420 and input/output data mask signal DQM, and performs an operation to obtain the logical product of test mode signal TM and input/output data mask signal DQM, to output the operation result as sample signal SAMPL.

Figure 11:
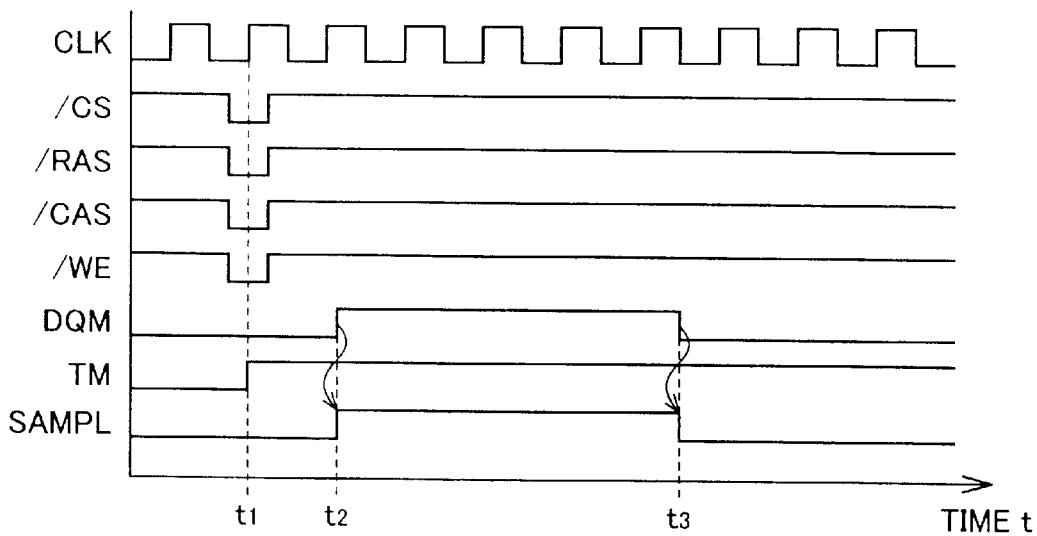
FIG. 11 is a timing chart showing the operation of the test mode reference potential generating circuit when the test is carried out using the test-sample signal generating circuit shown in FIG. 10.

FIG. 11 is a timing chart showing the operation of test mode reference potential generating circuit 107 when the test is conducted using test-sample signal generating circuit 502.

Referring to FIG. 11, the operation of generation of test mode signal TM at time t1 is the same as the operation shown in FIG. 5, so that the description thereof will not be repeated.

After generation of test mode signal TM at time t1, input/output data mask signal DQM is changed to be in an activated state (H level) at time t2. Input/output data mask signal DQM in the activated state is input into SAMPL generating circuit 427, and sample signal SAMPL output from AND gate 426 will be in an activated state (H level).

The operation described above turns on transfer gate 304 within switch stage 301 of test mode reference potential generating circuit 107 shown in FIG. 3, and charges capacitor 307 in latch stage 302 with reference potential Vreft.

Subsequently, input/output data mask signal DQM is changed to be in an inactivated state (L level) at time t3. Input/output data mask signal DQM in the inactivated state is input into SAMPL generating circuit 427, and thus sample signal SAMPL output from NAND gate 426 will be in an inactivated state (L level).

This turns off transfer gate 304 within switch stage 301 of test mode reference potential generating circuit 107, and hence the connection between latch stage 302 and output stage 300 is cut off.

Consequently, when the test starts after time t3, reference potential Vreft stored in capacitor 307 within latch stage 302 of test mode reference potential generating circuit 107 is supplied to VPP generating circuit 111, and therefore reference potential Vreft will not be affected at all by variations of power-supply node VCC during the test mode.

Therefore, by generating test mode signal TM and sample signal SAMPL by the combination of input/output data mask signal DQM and an address signal, stable reference potential Vreft can be supplied to VPP generating circuit 111 without any adverse effect of variations of power-supply node VCC during the test mode.

Fourth Embodiment

Figure 12:
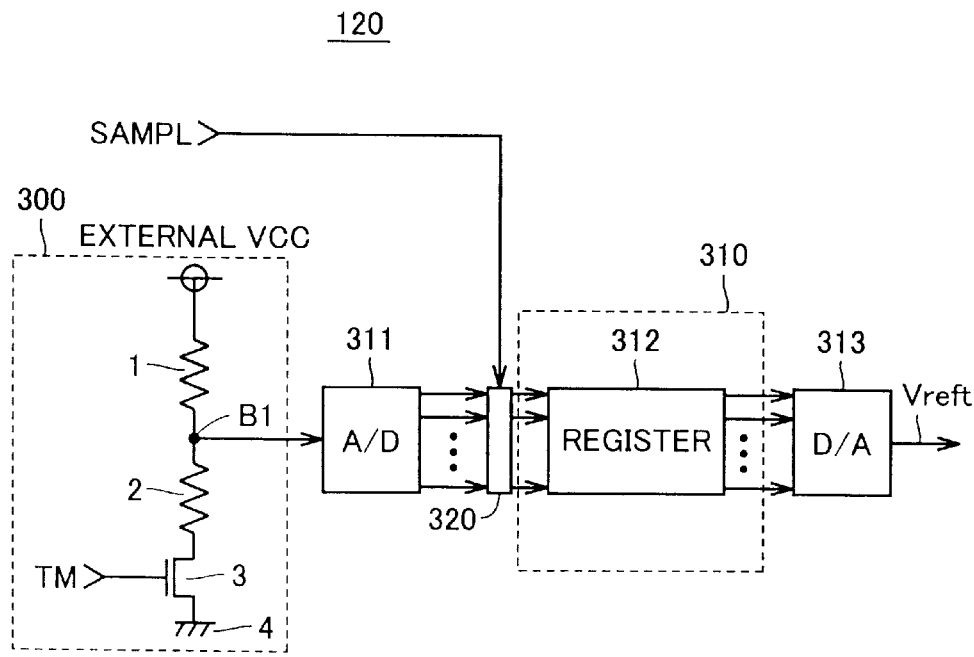
FIG. 12 is a circuit diagram showing the entire configuration of a test mode reference potential generating circuit according to the fourth embodiment of the present invention.

FIG. 12 is a circuit diagram showing the entire configuration of a test mode reference potential generating circuit 120 according to the fourth embodiment of the present invention.

Referring to FIG. 12, test mode reference potential generating circuit 120 includes an output stage 300, a latch stage 310, a switch stage 320, an analog-to-digital (hereinafter referred to as A/D) converting circuit 311, and a digital-to-analog (hereinafter referred to as D/A) converting circuit 313. The circuit configuration of output stage 300 is the same as the circuit configuration of output stage 300 of test mode reference potential generating circuit 107 shown in FIG. 3, so that the description thereof will not be repeated.

A/D converting circuit 311 encodes reference potential Vreft output from output node B1 of output stage 300 into a digital signal.

D/A converting circuit 312 converts the digitized reference potential Vreft read from latch stage 310 into an analog signal and outputs the converted signal.

Figure 13:
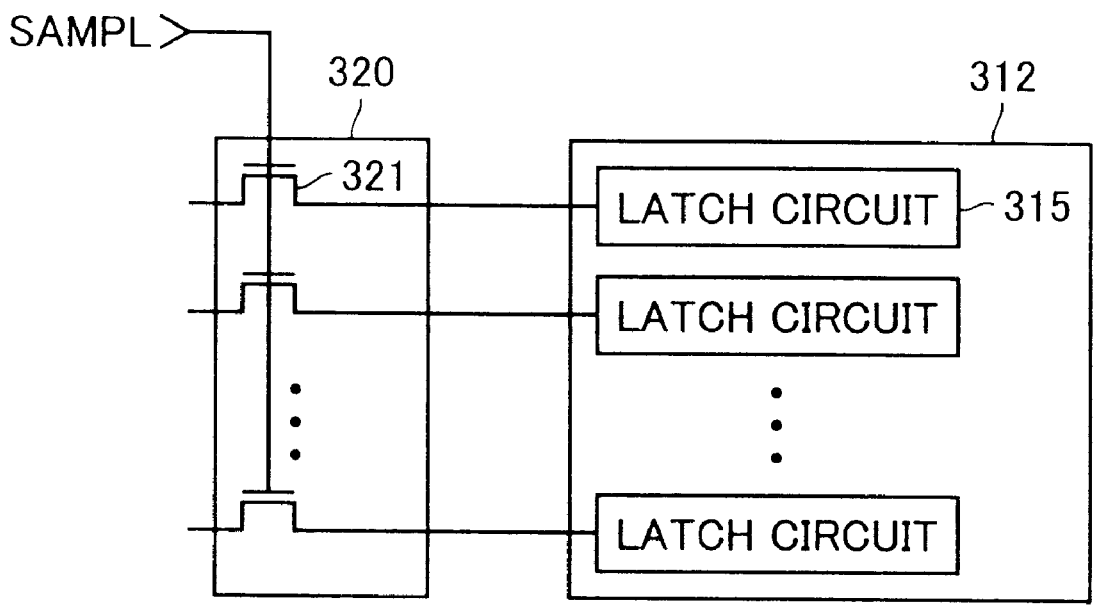
FIG. 13 is a circuit diagram showing details of a switch stage and a latch stage shown in FIG. 12.

FIG. 13 is a circuit diagram showing details of switch stage 320 and latch stage 310 shown in FIG. 12.

Referring to FIG. 13, latch stage 310 is constituted by a register 312, which includes a plurality of latch circuits 315. Further, switch stage 320 includes N-channel MOS transistors 321 of a number equal to the number of latch circuits 315, and each of N-channel MOS transistors 321 is connected to each of latch circuits 315 within register 312.

It is noted that test mode signal TM input into output stage 300 and sample signal SAMPL input into the gate of N-channel MOS transistor 321 of switch stage 320 are generated using test-sample signal generating circuits 400, 501 or 502 shown in the first to the third embodiments.

Next, the operation of test mode reference potential generating circuit 120 is described.

When test mode signal TM to be input into output stage 300 is changed to be in an activated state, reference potential Vreft is output from output node B1 of output stage 300. Reference potential Vreft output from node B1 is input into A/D converting circuit 311. A/D converting circuit 311 digitizes reference potential Vreft output from node B1.

Subsequently, when sample signal SAMPL is activated, N-channel MOS transistor 321 within switch stage 310 is turned on, resulting that latch circuit 315 within register 312 performs writing of the value of reference potential Vreft digitized by A/D converting circuit 311.

Subsequently, when sample signal SAMPL is changed to be in an inactivated state, N-channel MOS transistor 321 in switch stage 320 is turned off. At that moment, register 312 reads the digitized value of reference potential Vreft stored in latch circuit 315, and outputs the value to D/A converting circuit 313. D/A converting circuit 313 receives the digital signal output from register 312, converts the digital signal into an analog signal, and outputs the converted signal as reference potential Vreft.

By the operation described above, test mode reference potential generating circuit 120 digitizes reference potential Vreft output from output stage 300 and stores the digitized value into register 312 within latch stage 310, and therefore, in addition to the fact that stable reference potential Vreft can be attained during the test mode, the needs for frequent latch of reference potential Vreft output from output stage 300 during the test mode can be eliminated.

It is noted that, though the description has been made for the reference potential generating circuit supplying a reference potential to a VPP generating circuit, the present invention can also be applied to the other internal potential generating circuits, for example, a reference voltage generating circuit used in supplying of a reference potential to an internal down-converting circuit or the like.

Although the present invention has been described and illustrated in detail, it is clearly understood that the same is by way of illustration and example only and is not to be taken by way of limitation; the spirit and scope of the present invention being limited only by the terms of the appended claims.

What is claimed is:

1. A semiconductor memory device having a test mode, comprising:

a memory cell array;

an internal potential generating circuit generating an internal potential;

a reference potential generating circuit generating a reference potential and supplying the reference potential to said internal potential generating circuit; and a control circuit controlling said memory cell array in response to a plurality of control signals and address signals externally applied;

said control circuit outputting a test mode signal indicating said test mode in response to said plurality of control signals and address signals, and further outputting a sample signal in response to said test mode signal, and said reference potential generating circuit latching said reference potential in response to said sample signal and supplying the latched reference potential to said internal potential generating circuit.

2. The semiconductor memory device according to claim 1, wherein said reference potential generating circuit includes an output stage outputting said reference potential in response to said test mode signal, a latch stage latching the reference potential output from said output stage, and a switch stage connecting said output stage to said latch stage in response to said sample signal.

3. The semiconductor memory device according to claim 2, wherein said latch stage includes a capacitor, and said switch stage includes a transfer gate turned on in response to said sample signal.

4. The semiconductor memory device according to claim 3, wherein said control circuit includes a command decoder receiving said control signal and outputting a command, an address decoder receiving said address signal and outputting a signal, a test signal generating circuit generating said test mode signal in response to a combination of the command output from said command decoder and the signal output from said address decoder, and a sample signal generating circuit outputting the sample signal in response to said test mode signal.

5. The semiconductor memory device according to claim 4, wherein said sample signal generating circuit generates said sample signal in response to a combination of said test mode signal, a mode register setting command output from said command decoder and the signal output from said address decoder.

6. The semiconductor memory device according to claim 4, wherein said sample signal generating circuit generates said sample signal in response to a combination of said test mode signal, said control signal and the signal output from said address decoder.

7. The semiconductor memory device according to claim 2, wherein said latch stage includes a register; and said reference potential generating circuit further includes an analog-to-digital converting circuit converting the reference potential output from said output stage from an analog value into a digital value to be supplied to said register via said switch stage, and a digital-to-analog converting circuit converting the reference potential output from said register from the digital value into the analog value.

* * * * *